United States Patent
Vereen et al.

(10) Patent No.: US 8,610,099 B2
(45) Date of Patent: Dec. 17, 2013

(54) PLANAR RESISTIVE MEMORY INTEGRATION

(75) Inventors: Lidia Vereen, San Ramon, CA (US); Bruce Bateman, Fremont, CA (US); Louis Parrillo, Austin, TX (US); Elizabeth Friend, Sunnyvale, CA (US); David Eggleston, San Jose, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/586,580

(22) Filed: Aug. 15, 2012

(65) Prior Publication Data

US 2013/0207066 A1 Aug. 15, 2013

Related U.S. Application Data

(60) Provisional application No. 61/523,821, filed on Aug. 15, 2011.

(51) Int. Cl.
*H01L 21/306* (2006.01)
*H01L 29/86* (2006.01)

(52) U.S. Cl.
USPC ............. 257/3; 257/2; 257/5; 257/E27.004; 438/692

(58) Field of Classification Search
None
See application file for complete search history.

(56) References Cited

U.S. PATENT DOCUMENTS

| | | | |
|---|---|---|---|
| 6,750,101 B2 * | 6/2004 | Lung | 438/257 |
| 6,753,561 B1 * | 6/2004 | Rinerson et al. | 257/295 |
| 7,534,647 B2 * | 5/2009 | Lung | 438/95 |
| 8,143,089 B2 * | 3/2012 | Lung | 438/95 |
| 2005/0136602 A1 * | 6/2005 | Hsu et al. | 438/296 |
| 2006/0003471 A1 * | 1/2006 | Deak | 438/3 |
| 2006/0099813 A1 * | 5/2006 | Pan et al. | 438/691 |
| 2006/0171200 A1 | 8/2006 | Rinerson et al. | |
| 2008/0054341 A1 * | 3/2008 | Natori et al. | 257/316 |
| 2010/0259960 A1 * | 10/2010 | Samachisa | 365/51 |
| 2013/0003437 A1 * | 1/2013 | Siau | 365/148 |

* cited by examiner

*Primary Examiner* — Thomas Dickey
*Assistant Examiner* — Joseph Schoenholtz
(74) *Attorney, Agent, or Firm* — Stolowitz Ford Cowger LLP

(57) ABSTRACT

In an example, a single damascene structure is formed by, for example, providing a dielectric layer, forming a void in the dielectric layer, and forming a portion of a first two-terminal resistive memory cell and a portion of a second two-terminal resistive memory cell within the void. The portions of the two-terminal resistive memory cells may be vertically stacked within the void.

23 Claims, 13 Drawing Sheets

PLANAR RESISTIVE MEMORY INTEGRATION

PRIORITY

This application claims benefit of U.S. Provisional Application No. 61/523,821 filed on Aug. 15, 2011, entitled: NOVEL VERTICAL PLANAR CMOx PROCESS, which is herein incorporated by reference in its entirety.

BACKGROUND

A resistive memory cell can comprise a two-terminal memory element including an electrolytic tunnel barrier and a mixed valence conductive oxide. U.S. patent application Ser. No. 11/095,026, filed Mar. 30, 2005, now published as U.S. Pub. No. 2006/0171200, and entitled "Memory Using Mixed Valence Conductive Oxides," is hereby incorporated by reference in its entirety for all purposes and describes non-volatile third dimensional memory elements that can be arranged in a two-terminal, cross-point memory array.

In such a memory cell, a voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen—PCMO perovskites and lanthanum-nickel-oxygen—LNO perovskites) change valence, their conductivity changes. Additionally, oxygen accumulation in certain electrolytic tunnel barriers (e.g., yttrium stabilized zirconia—YSZ) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both.

The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts. In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., fabricated front-end-of-the-line FEOL). Further, third dimension memory cells in a memory subsystem can be produced with identical or equivalent fabrication processes that produce a logic subsystem. As such, both subsystems can be manufactured in the same or different fabrication plants, or "fabs," to form processor-memory system as an integrated circuit on a single substrate (e.g., the FEOL portion and BEOL portion comprise a unitary die). For example, this enables a manufacturer to first fabricate a logic subsystem using a CMOS process in a first fab as part of a front-end-of-the-line (FEOL) process, and then port (e.g., transport) a logic subsystem to a second fab at which additional CMOS processing can be used to fabricate multiple memory layers directly on top of logic subsystem as part of a back-end-of-the-line (BEOL) process, whereby the one or more layers of memory are fabricated directly above a substrate (e.g., a silicon wafer) that includes the logic subsystem and its associated circuitry and inter-level interconnect structure (e.g., formed FEOL) for electrically communicating signals between the logic subsystem and the one or more layers of memory. The logic subsystem therefore can be configured to interact with different memory technologies, such as DRAM, SRAM, ROM, and FLASH memories, without fabricating the memory subsystem in a different or a more complex fabrication process than is used to produce logic subsystem. As such, the memory subsystem can be vertically stacked on top of the logic subsystem without an intervening substrate.

Multiple memory layers may be fabricated to arrange the third dimension memory cells in a stacked cross-point array. Stacked cross-point arrays can include memory cells that share conductive array lines with memory cells in other layers as depicted in stacked cross-point array or the conductive array lines in each layer can be electrically isolated (e.g., by a dielectric material such as $SiO_2$ or the like) from the conductive array lines in adjacent memory layers (not shown). That is, two-terminal memory elements can be arranged in a cross-point array (e.g., a two-terminal cross-point memory array) such that one terminal is electrically coupled with an X-direction line and the other terminal is electrically coupled with a Y-direction line and data operations to the two-terminal memory element require a potential difference of sufficient magnitude be applied across the conductive array lines the memory cell is positioned between such the potential difference is applied across the two terminals of the memory element. A stacked cross-point array can include multiple cross-point arrays stacked upon one another, sometimes sharing X-direction and Y-direction lines between layers, and sometimes having isolated lines. Both single-layer cross-point arrays and stacked cross-point arrays can be arranged as third dimension memories An array of two-terminal resistive memory cells may be integrated on a silicon wafer. Known schemes for integrating such an array include a vertical arrangement of lines or a planar arrangement of the lines (relative to the substrate). In the vertical arrangement, lines of the array, e.g. bit lines and/or word lines, run perpendicular to the upper surface of the substrate. In the planar arrangement, lines of the array, e.g. bit lines and/or word lines, do not run perpendicular to the upper surface of the substrate.

Known schemes for integrating an array of two-terminal resistive memory cells onto a silicon wafer according to the planar arrangement do not scale well below 20 nm manufacturing and/or are relatively expensive to employ.

BRIEF DRAWINGS DESCRIPTION

DETAILED DESCRIPTION

In an example, a single damascene structure is formed by, for example, providing a dielectric layer, forming a void in the dielectric layer, and forming a portion of a first two-terminal resistive memory cell and a portion of a second two-terminal resistive memory cell within the void. The portions of the two-terminal resistive memory cells may be vertically stacked within the void. Each two-terminal resistive memory cell includes at least one layer of memory material to form a resistive memory element, such as a RRAM memory element, for example. Each layer of memory material may be a thin-film layer formed by deposition processes including but not limited to atomic layer deposition (ALD), plasma enhanced ALD (PEALD), physical sputtering, reactive sputtering, co-sputtering, chemical vapor deposition (CVD) and its variants, physical vapor deposition (PVD) and its variants spin-on deposition, laser deposition, just to name a few.

In the example described above, less lithography steps are required than known processes (comparing arrays having similar attributes). The reduced number of lithography steps reduces manufacturing costs.

Figure 1:
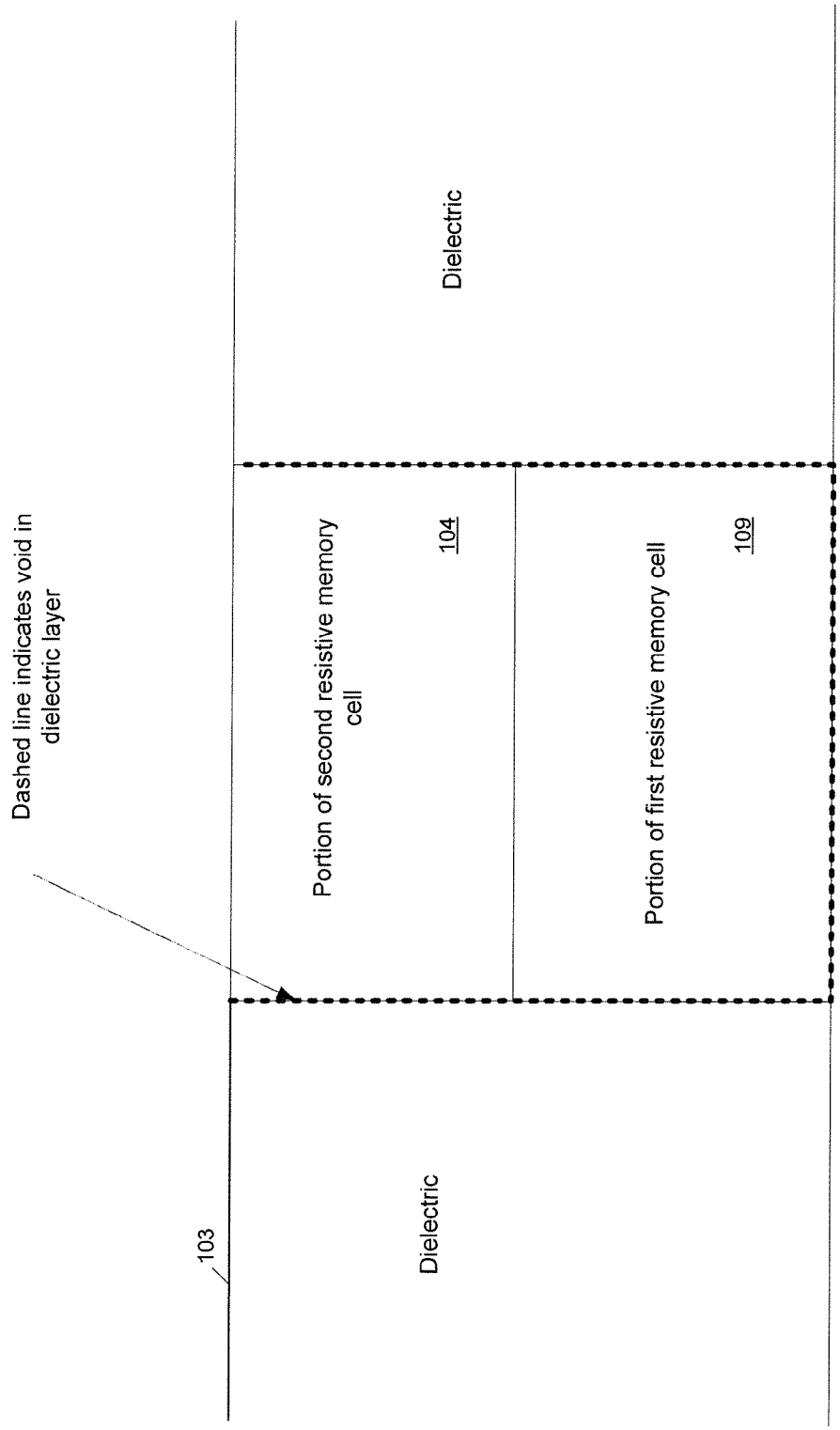
FIG. 1 illustrates an example device having a portion of a first two-terminal resistive memory cell and a portion of a second two-terminal resistive memory cell formed in a void of a dielectric layer.

FIG. 1 illustrates an example device having a portion 109 of a first two-terminal resistive memory cell and a portion 104 of a second two-terminal resistive memory cell formed in a void of a dielectric layer 103. The illustrated structure comprises a single damascene structure (e.g., due to reduced fabrication steps, reduced number of photomasks, higher die yields due to few fabrications steps, etc.)

Figure 2:
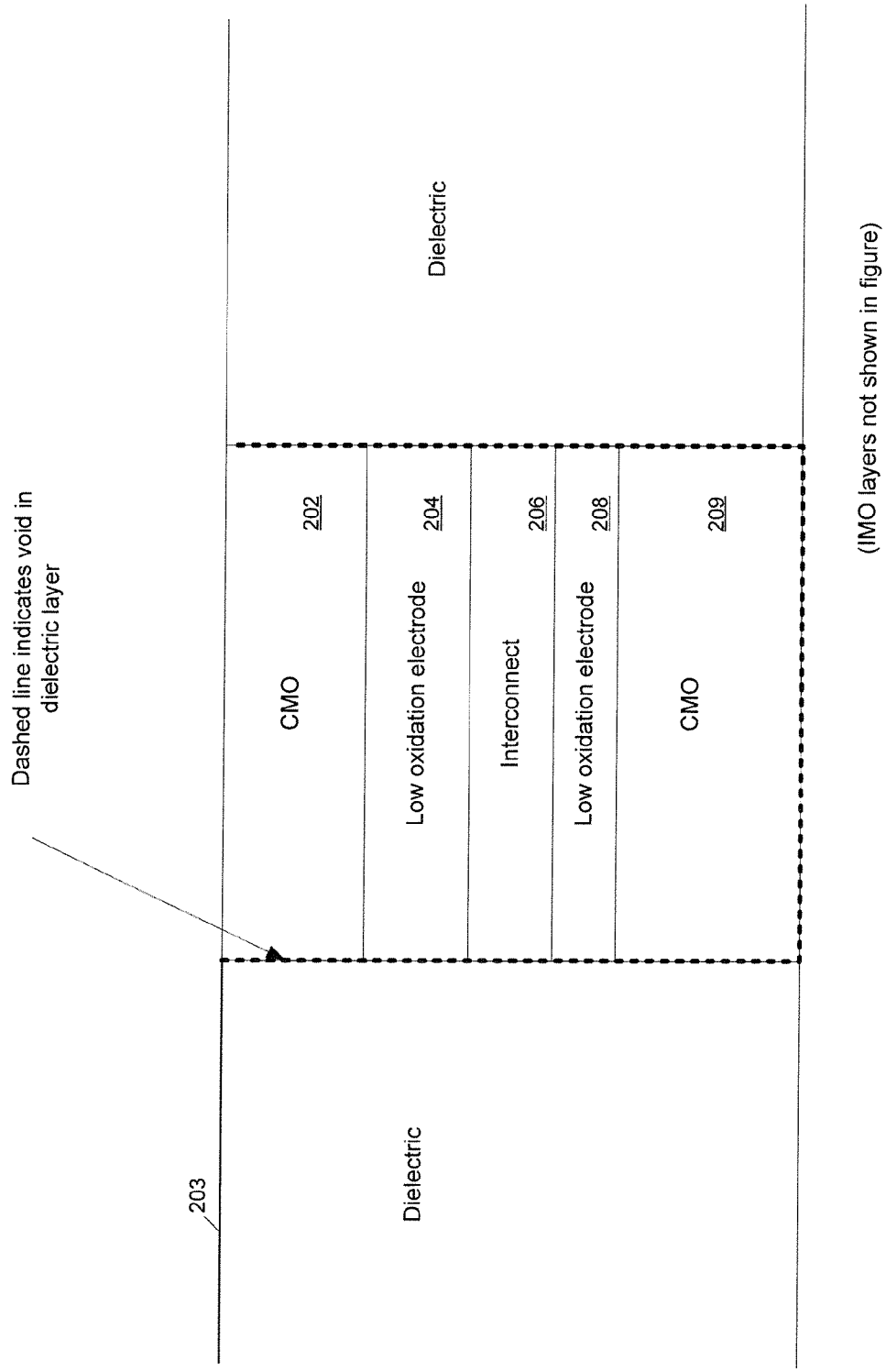
FIG. 2 illustrates an example of a single damascene structure having a plurality of Conductive Metal Oxide (CMO) layers.

FIG. 2 illustrates an example of a single damascene structure having a plurality of Conductive Metal Oxide (CMO) layers. A structure within the void of the dielectric layer 203 comprises a CMO layer 202, a low oxidation electrode 204, an interconnect 206, a low oxidation electrode 208, and a CMO layer 209.

Insulating metal oxide (IMO) layers corresponding to the CMO layers 202 and 209 are not illustrated in FIG. 2. As will be discussed later, in an example the IMO layer corresponding to CMO layer 209 may be within the void. The IMO layer corresponding to CMO layer 202 may be formed above the void. However, the disclosure is not limited in this respect (in other examples each IMO layer could be formed within the void, in other examples one IMO layer could be formed beneath the void and one IMO layer formed above the void, or one IMO layer could be formed beneath the void and one IMO layer formed within the void, etc). A layer or layers of other types of memory materials may be used for the examples described and depicted herein and the types of memory materials used are not limited to the CMO and IMO layers described herein. In particular, the principles described herein may be applied to memory materials comprising a metal oxide. For example, some filamentary RRAMs start with an insulating metal oxide, but may not necessarily include a conductive metal oxide adjacent to the insulating metal oxide.

Figure 3:
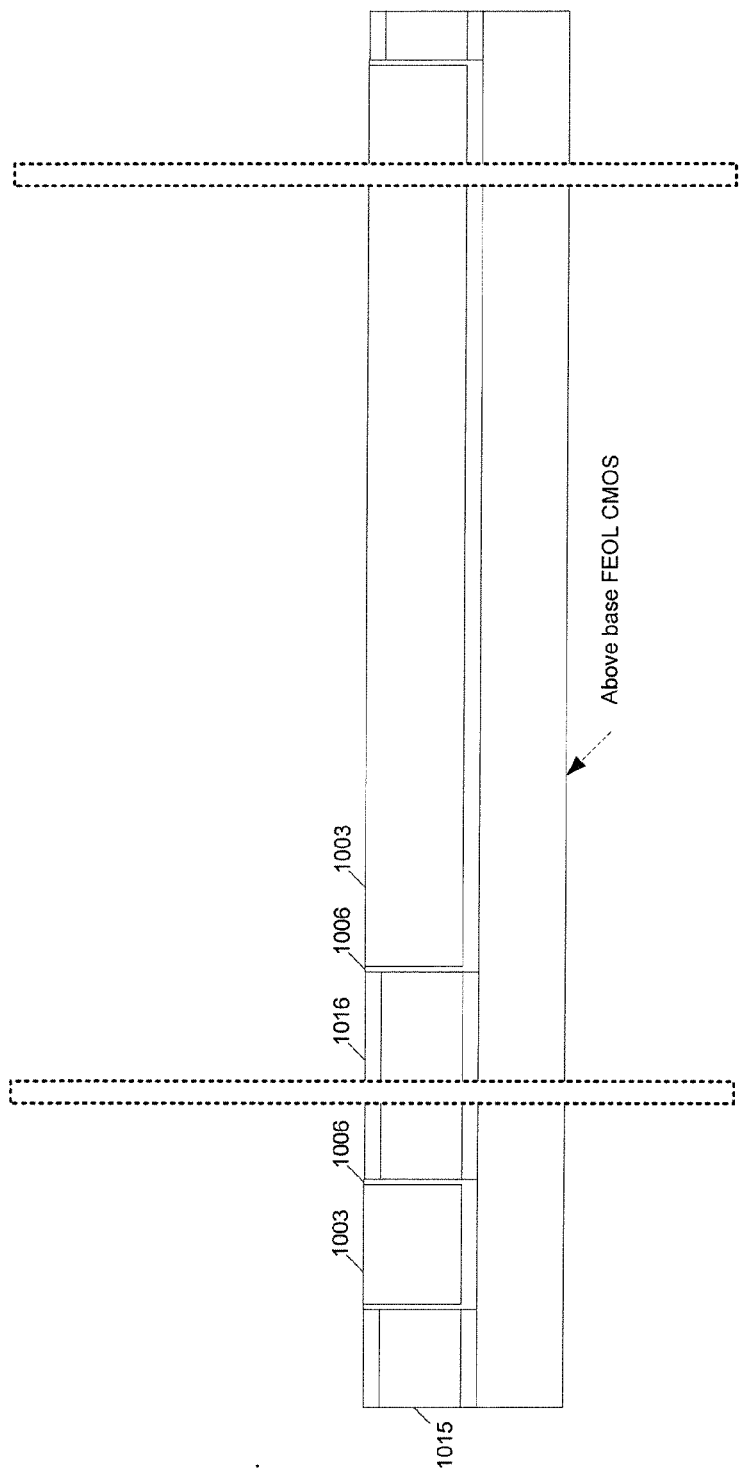
FIG. 3 illustrates an example pre-bottom metal trench formation process for planar resistive memory integration.

FIG. 3 illustrates an example pre-bottom metal trench formation process for planar resistive memory integration.

Any known process for forming lines may be used to form a word line and a bit line. In an example, a void, e.g. a trench or via, is formed in insulating material 1015, e.g. SiO2 or SiNx. The void is filled with a conductive material, e.g. Cu 1003 and Cu barrier 1006. The void may be filled using metallization deposition, in an example. In an example, the metallization deposition may include Physical Vapor Deposition (PVD) Cu barrier, PVD Cu seed, Electro-Chemical Plating (ECP) Cu, or the like.

Planarization, e.g. Chemical-Mechanical Planarization (CMP), may be used after filling the void. Planarization may stop on a hardmask or other lithography process layer, e.g. SiNx 1016.

Figure 4:
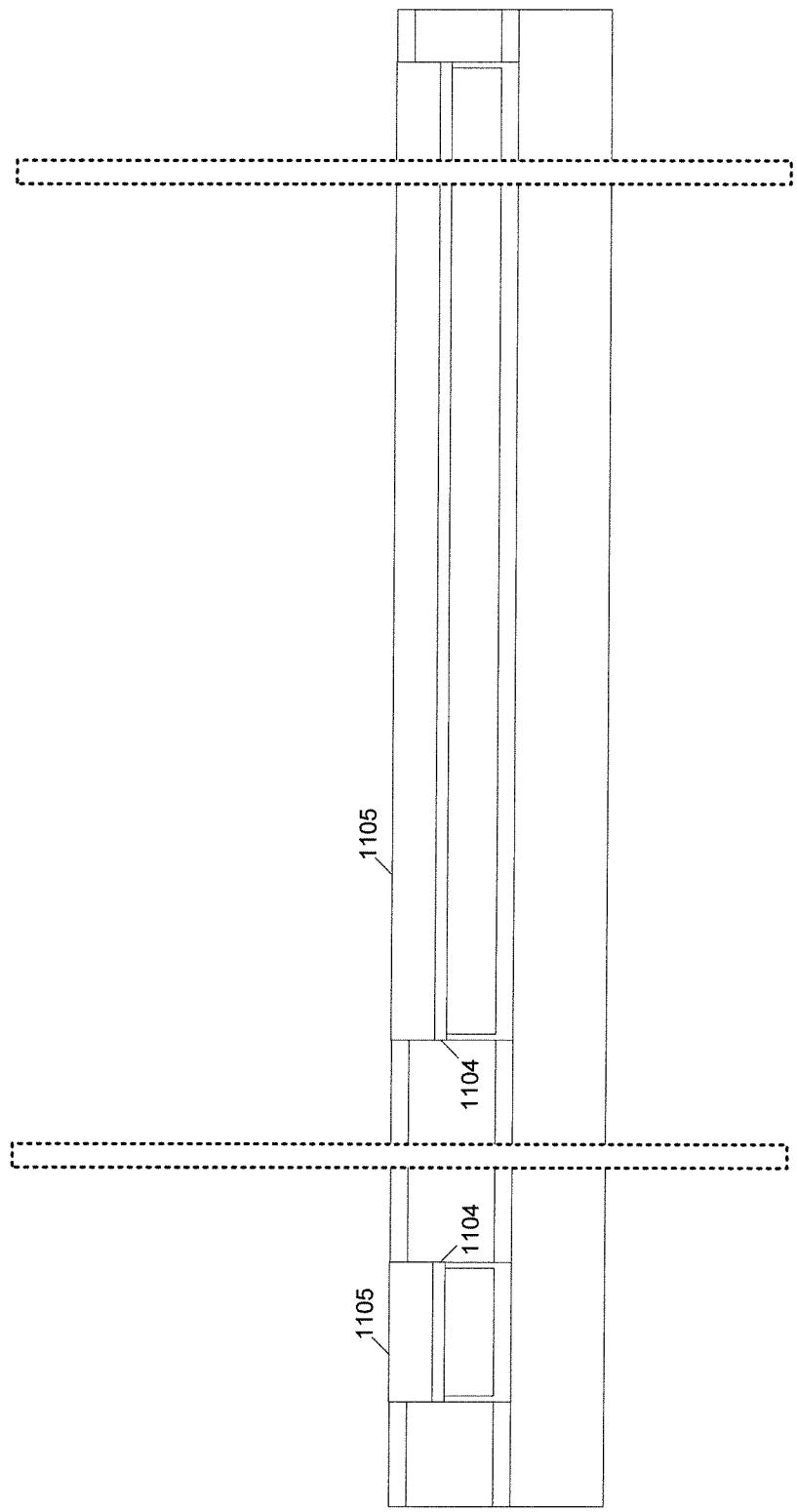
FIG. 4 illustrates an example bottom electrode formation process for planar resistive memory integration.

FIG. 4 illustrates an example bottom electrode formation process for planar resistive memory integration.

The conductive material, e.g. Cu and Cu barrier, is recessed to form a void. Recessing may be by wet etch, in an example. After recessing, a barrier 1104, such as a copper diffusion area may be formed by, for example, selective deposition. In an example, an adhesion layer (not shown) may be formed over the barrier 1104. The adhesion layer and the barrier 1104 may be the same material.

A low oxidation electrode 1105, e.g. a noble metal electrode, e.g. platinum, is formed above the barrier 1104 by, for example, selective Atomic Layer Deposition (ALD) or electroless deposition. A CMP buff may be applied to an upper surface of the low oxidation electrode.

Figure 5:
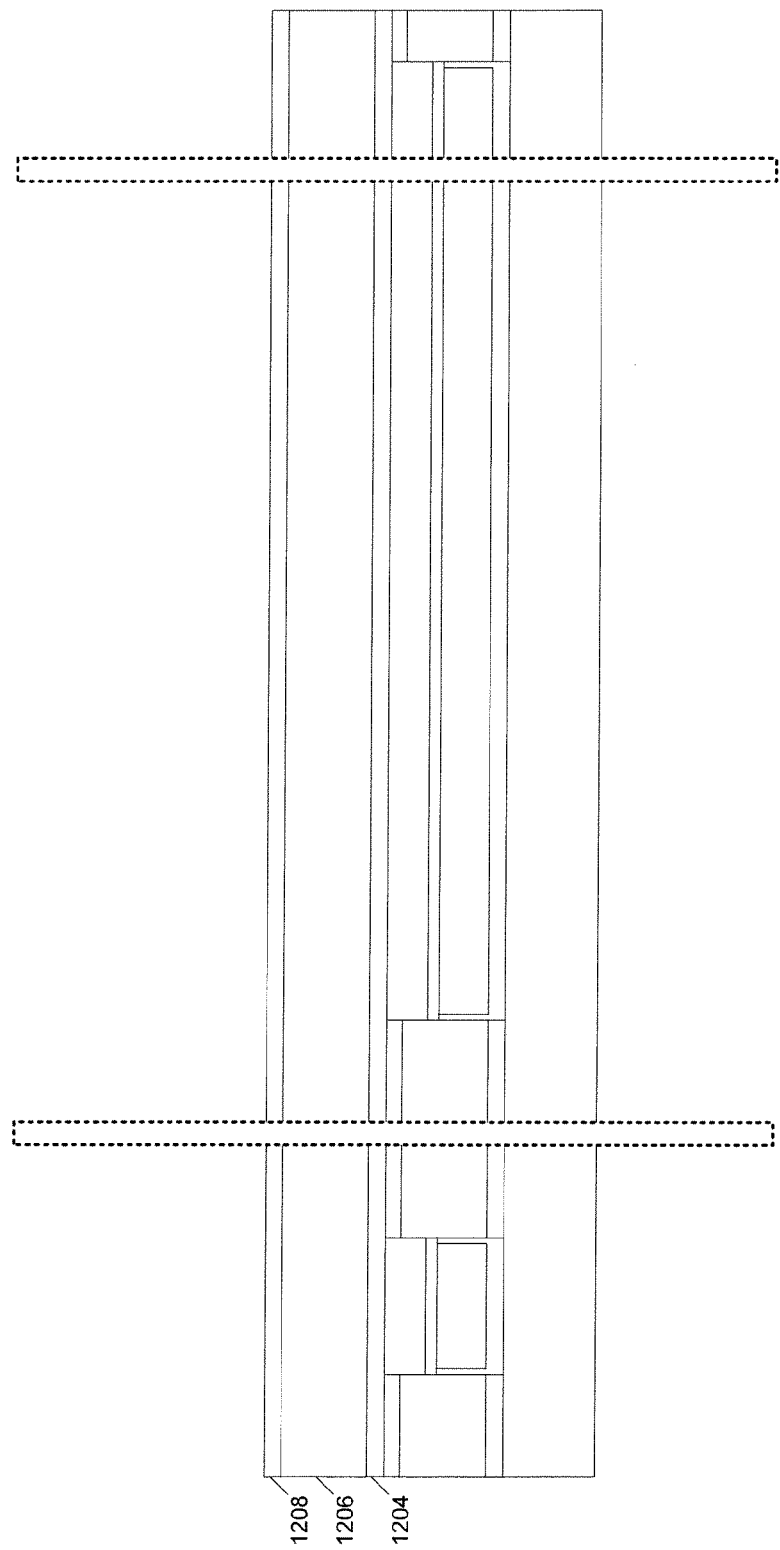
FIG. 5 illustrates an example inter-layer dielectric formation process for planar resistive memory integration.

FIG. 5 illustrates an example inter-layer dielectric formation process for planar resistive memory integration.

An Inter-Layer Dielectric (ILD) may be formed as shown in FIG. 5. In an example, the ILD layer includes an etch stop layer 1204 (or other lithography process layer), e.g. SiNx formed via CVD, a dielectric material 1206, e.g. Tetraethyl Orthosilicate (TEOS) formed via CVD, a low-k dielectric material, or the like, and a mask 1208, e.g. a hardmask or photoresist.

Figure 6:
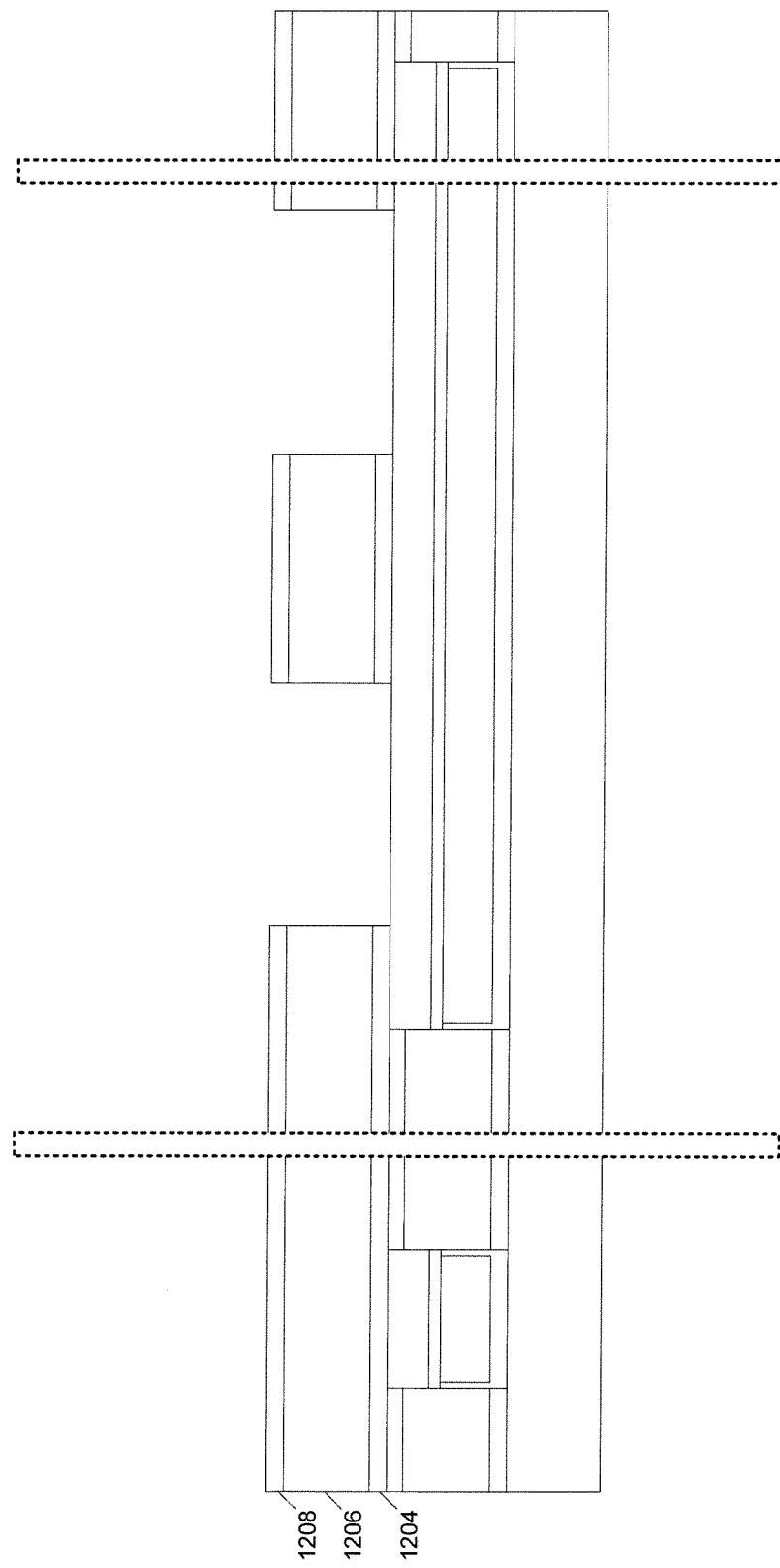
FIG. 6 illustrates an example void formation process for planar resistive memory integration.

FIG. 6 illustrates an example void formation process for planar resistive memory integration.

As shown in FIG. 6, voids, e.g. trenches and/or vias, are formed in the ILD (1204, 1206, and 1208). In the illustration the voids comprise trenches running orthogonally to the word lines, although in other examples the voids comprise vias. The voids may be formed by, for example, Extreme Ultraviolet (EUV) lithography, up to quad-patterning, imprint lithography, dielectric RIE hardmask etch, Dielectric etch, e.g. Dielectric RIE TEOS, etch stop, e.g. dielectric RIE SiNx, or the like.

Figure 7:
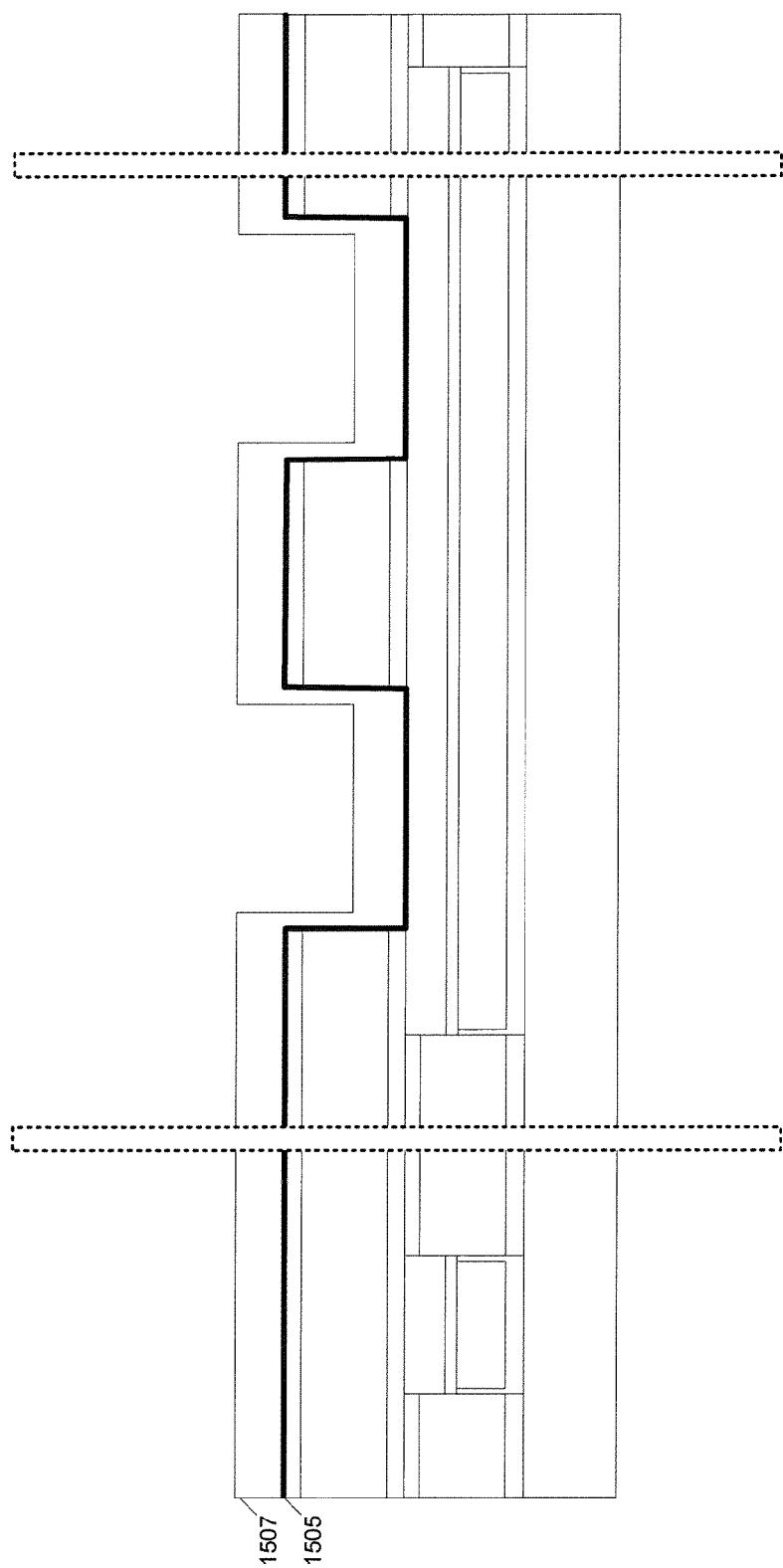
FIG. 7 illustrates an example metal oxide deposition process for planar resistive memory integration.

FIG. 7 illustrates an example metal oxide deposition process for planar resistive memory integration.

An Insulating Metal Oxide (IMO) 1505 and a Conductive Metal Oxide (CMO) 1507 are formed, by for example, ALD. The IMO 1505 may comprise HfO2, TaOx, ZrO2, or Al2Ox, for example.

Figure 8:
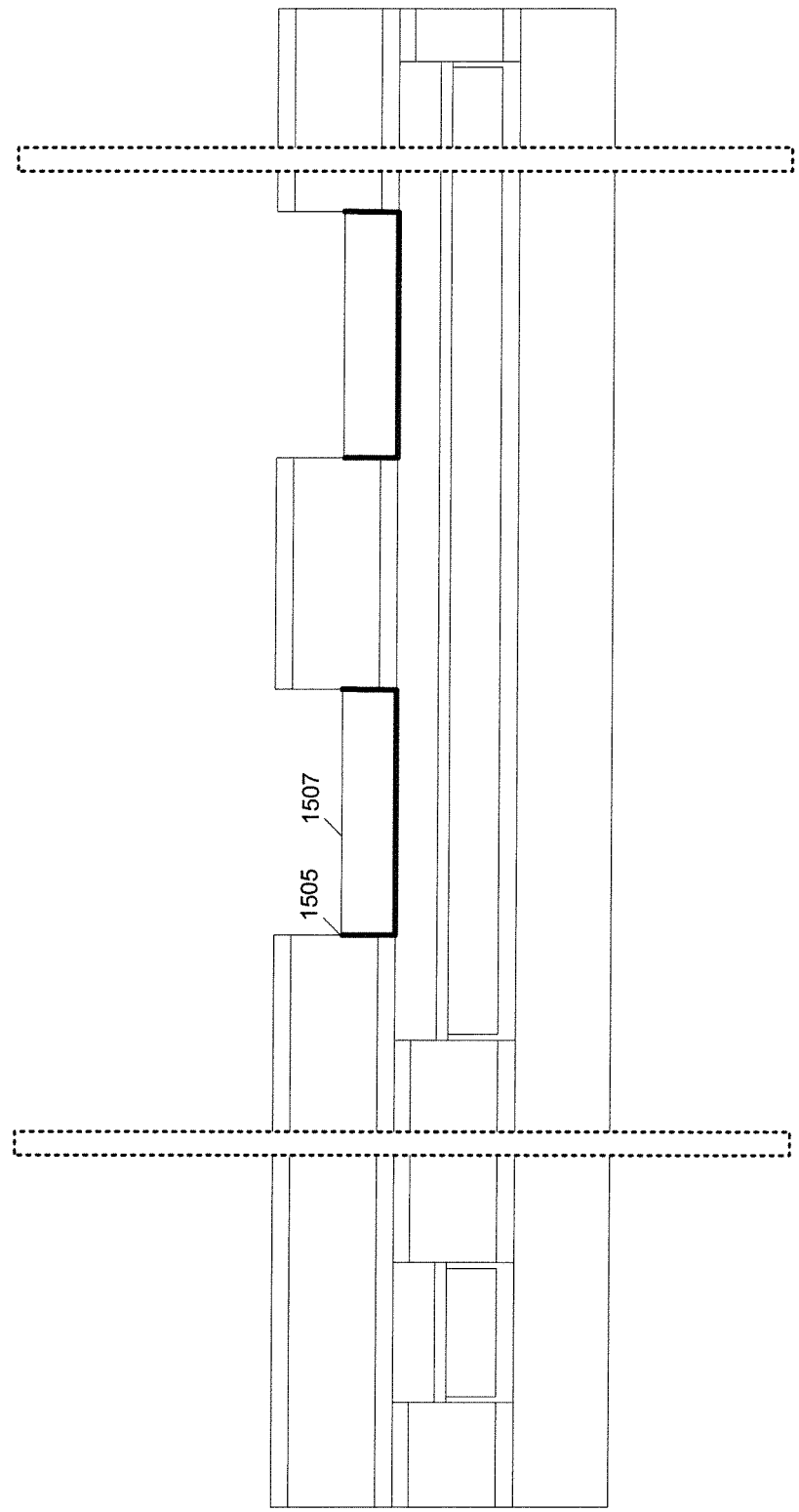
FIG. 8 illustrates an initial portion of an example first device formation process for planar resistive memory integration.

FIG. 8 illustrates an initial portion of an example first device formation process for planar resistive memory integration.

As shown in FIG. 8, a portion of the IMO 1505 and the CMO 1507 may be removed by, for example, CMP and/or recessing, e.g. dry etch or wet etch.

Figure 9:
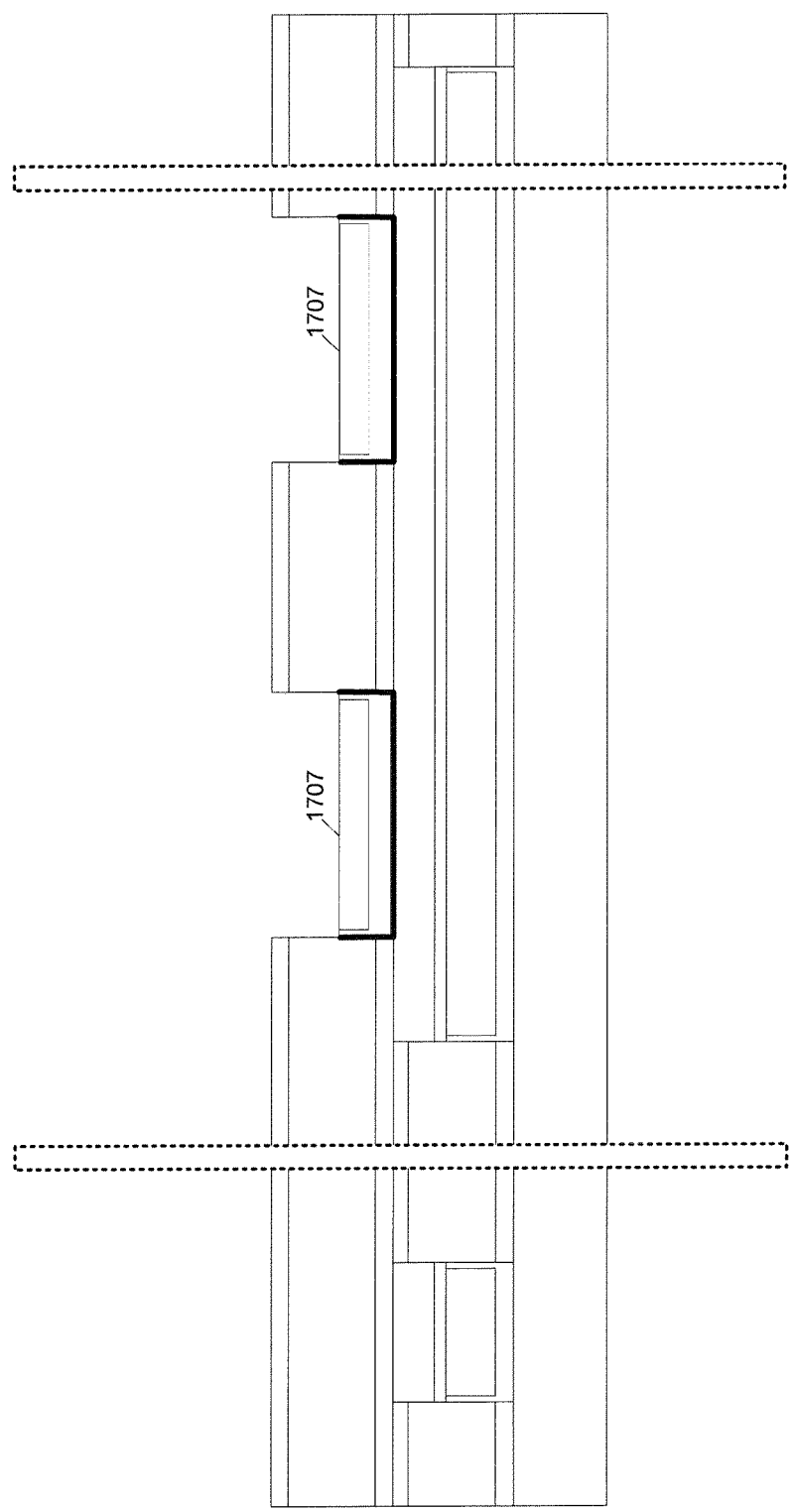
FIG. 9 illustrates the subsequent portion of the example first device formation process of FIG. 8.

FIG. 9 illustrates the subsequent portion of the example first device formation process of FIG. 8.

As shown in FIG. 9, a low oxidation electrode layer may be formed above the recessed CMO material. As described previously, selective Atomic Layer Deposition (ALD) or electroless deposition may be used. A portion of the low oxidation electrode layer may be removed by, for example, CMP and/or recessing, e.g. dry etch or wet etch, to form the low oxidation electrodes 1707.

Figure 10:
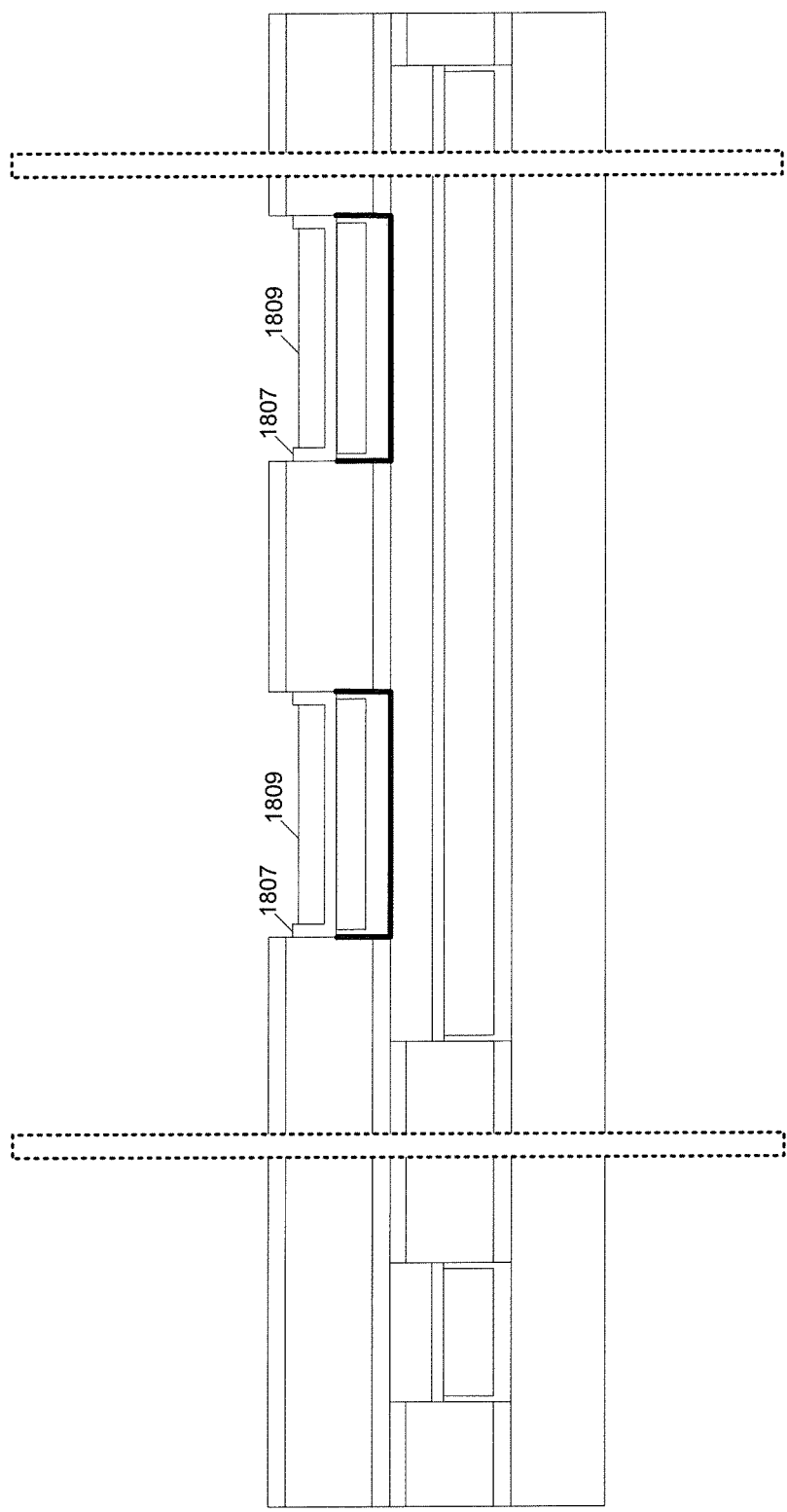
FIG. 10 illustrates an example interconnect formation process for planar resistive memory integration.

FIG. 10 illustrates an example interconnect formation process for planar resistive memory integration.

Another copper damascene process may be performed. The void is filled with a conductive material, e.g. Cu 1809 and Cu barrier 1807. The void may be filled using metallization deposition, in an example. In an example, the metallization deposition may include Physical Vapor Deposition (PVD) Cu barrier, PVD Cu seed, Electro-Chemical Plating (ECP) Cu. Recessing, e.g. dry etch or wet etch, may be performed to recess the conductive structure as shown.

Figure 11:
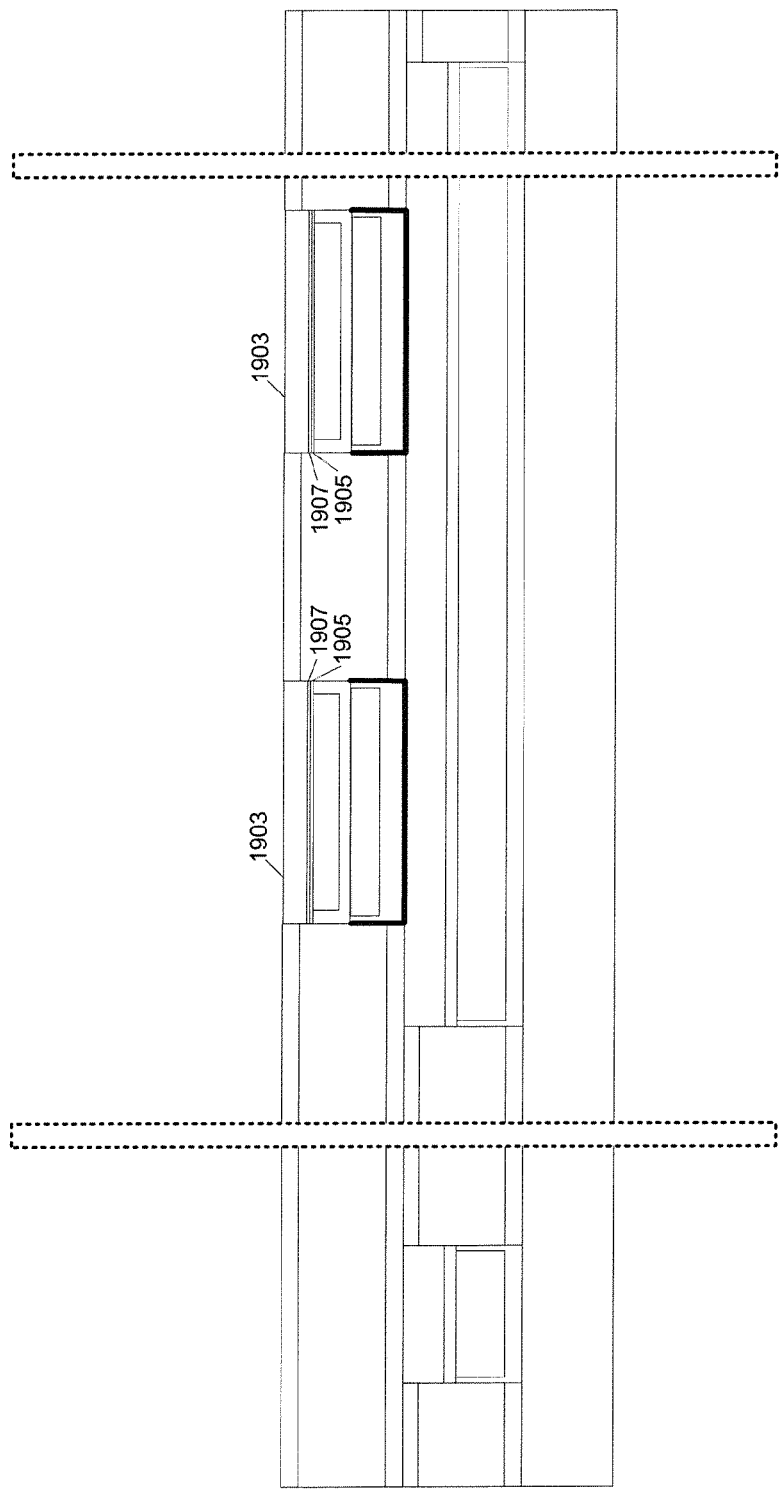
FIG. 11 illustrates an example second device formation process for planar resistive memory integration.

FIG. 11 illustrates an example second device formation process for planar resistive memory integration.

A barrier layer 1905 may be formed above the conductive material using any known method, e.g. selective ALD or copper plating. In an example, the barrier layer 1905 comprises a cobalt tungsten phosphide (CoWP) cap or a nickel platinum (NiP) cap.

The low oxidation electrodes 1907 may be formed above the barrier layer 1905. The CMO layer 1903 may be formed above the low oxidation electrodes 1907.

Figure 12:
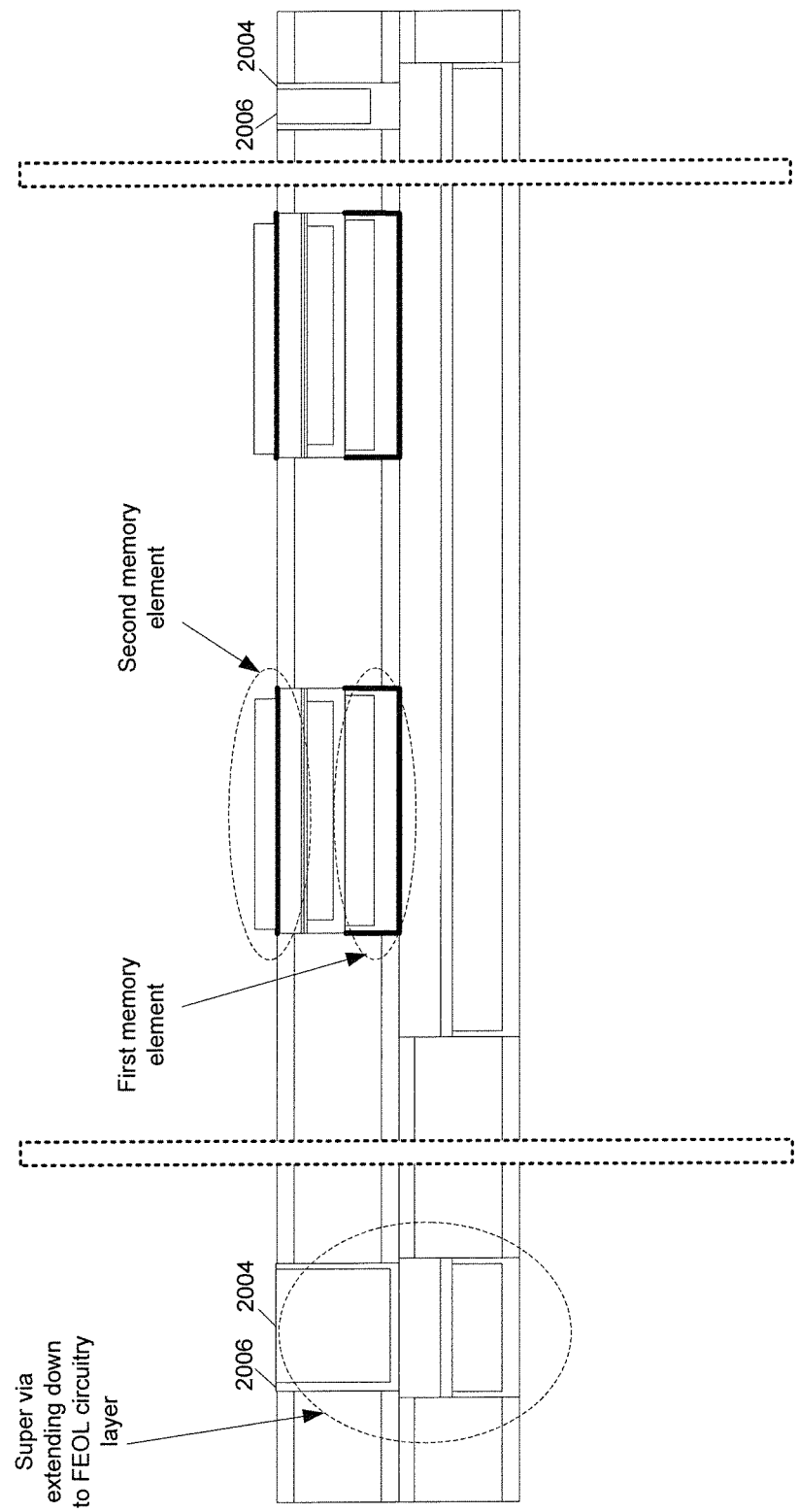
FIG. 12 illustrates an example super via formation process for planar resistive memory integration

FIG. 12 illustrates an example super via formation process for planar resistive memory integration.

A super via may be formed to a bit line contact, and a super via may be formed to a word line contact, as shown. The super vias may be formed by creating voids in the inter-layer dielectric by, for example, a deep reactive ion etch. The voids may be filled with a conductive material, e.g. Cu 2004 and Cu barrier 2006. The voids may be filled using metallization deposition, in an example. In an example, the metallization deposition may include Physical Vapor Deposition (PVD) Cu barrier, PVD Cu seed, Electro-Chemical Plating (ECP) Cu, or the like.

Planarization, e.g. Chemical-Mechanical Planarization (CMP), may be used after filling the void. Planarization may stop on a hardmask, e.g. SiNx.

FIG. 12 also shows a first resistive memory cell having a portion thereof formed in the void and a second resistive memory cell having a portion thereof formed in the void. The example first resistive memory cell comprises a low oxidation electrode (beneath the void), an IMO layer (within the void), a CMO layer (within the void), and another low oxidation electrode (within the void). The example second resistive memory cell comprises a low oxidation electrode (within the void), a CMO layer (within the void), an IMO layer (above the void), and another low oxidation electrode (above the void).

Figure 13:
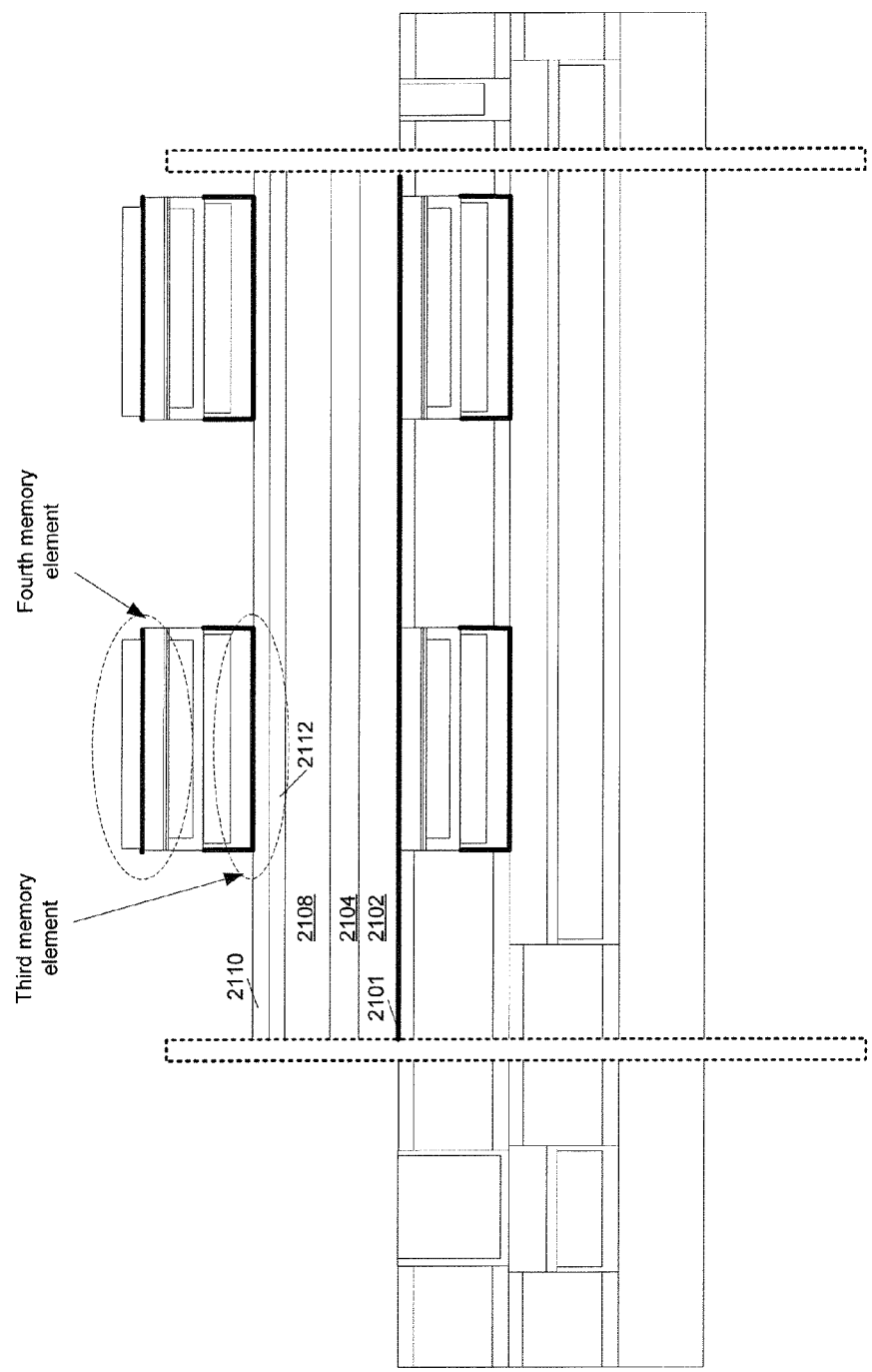
FIG. 13 illustrates an example third and fourth device formation process for planar resistive memory integration.

FIG. 13 illustrates an example third and fourth device formation process for planar resistive memory integration.

An IMO layer 2101, a low oxidation electrode 2102, a barrier layer 2104, a conductive layer 2108, e.g. Cu and a Cu barrier, a barrier layer 2112, and a low oxidation electrode 2110 may be formed above the void. In the illustrated example, the electrodes 2102 and 2110 comprise lines running orthogonally to the bit line (and parallel to the word line).

FIG. 13 also shows a third resistive memory cell and a fourth resistive memory cell formed above the first and second resistive memory cells. The third and fourth resistive memory cells may be formed by repeating processes described in FIGS. 5-11.

It should be appreciated that the process described by way of FIG. 13 may be repeated any number of times. For example, a fifth resistive memory cell (not shown) and a sixth resistive memory cell (not shown) could be formed above the third and fourth resistive memory cells. In some examples, four to sixteen layers of tunnel RRAM are provided.

It will be apparent to those having skill in the art that many changes may be made to the details of the above-described embodiments without departing from the underlying principles of the disclosure. The scope of this disclosure should, therefore, be determined only by the following claims.

The invention claimed is:

1. A method, comprising:
   providing a dielectric layer;
   forming a void in the dielectric layer; and
   forming a structure in the void, the structure comprising:
   a first layer of memory material;
   a first low oxidation electrode above the first layer of memory material;
   an interconnect above the first low oxidation electrode;
   a second low oxidation electrode above the interconnect; and
   a second layer of memory material above the second low oxidation electrode.

2. The method of claim 1, wherein the structure further comprises an insulating metal oxide (IMO) layer beneath the first layer of memory material.

3. The method of claim 1, further comprising:
   forming a word line; and
   forming the dielectric layer above the word line;
   wherein said void in the dielectric layer exposes a portion of an upper surface of the word line.

4. The method of claim 2, wherein the word line is orthogonal with respect to a conductive line of the interconnect.

5. The method of claim 1, wherein said void comprises a trench.

6. The method of claim 1, wherein said void comprises a via.

7. The method of claim 1, forming another structure above the void, the another structure comprising:
   a third layer of memory material;
   a third low oxidation electrode above the third layer of memory material;
   another interconnect above the third low oxidation electrode;
   a fourth low oxidation electrode above the another interconnect; and
   a fourth layer of memory material above the fourth low oxidation electrode.

8. The method of claim 7, wherein a conductive line of the another interconnect is orthogonal with respect to a conductive line of the interconnect.

9. The method of claim 1, wherein the structure comprises a portion of a first two-terminal resistive memory element and a portion of a second two-terminal resistive memory element.

10. The method of claim 1, further comprising:
depositing insulating metal oxide and conductive metal oxide above a word line; and
performing a planarization after the deposition.

11. The method of claim 10, further comprising:
performing a recessing of the deposited conductive metal oxide after the planarization; and
forming the first low oxidation electrode at least partially in the recess.

12. The method of claim 11, further comprising:
depositing the insulating metal oxide and the conductive metal oxide above the interconnect; and
performing another planarization after depositing the insulating metal oxide and the conductive metal oxide above the interconnect.

13. The method of claim 1, further comprising:
forming an insulating metal oxide layer above the void; and
forming a third low oxidization electrode above the insulating metal oxide layer that is formed above the void.

14. The method of claim 13, wherein the third low oxidation electrode comprises a line oriented orthogonally to a word line formed below the void.

15. The method of claim 1, wherein the first layer of memory material comprises at least one layer of a conductive metal oxide (CMO).

16. The method of claim 15, wherein the first layer of memory material further includes an insulating metal oxide (IMO) layer.

17. The method of claim 1, wherein the first layer of memory material comprises an insulating metal oxide (IMO) layer and at least one layer of a metal oxide.

18. An apparatus, comprising:
a dielectric layer;
wherein a bottom of the dielectric layer comprises first lithography process layer and a top of the dielectric layer comprises a second lithography process layer that is different than the first lithography process layer, without any intervening lithography process layers between the first lithography process layer and the second lithography process layer;
a void formed in the dielectric layer;
a portion of a first two-terminal resistive memory cell located within the void;
a portion of a second two-terminal resistive memory cell located above the first two-terminal resistive memory cell and within the void.

19. The apparatus of claim 18, wherein the portion of the first two-terminal resistive memory cell comprises a layer of resistive memory material and a low oxidation electrode, and wherein the portion of the second two-terminal resistive memory cell comprises a layer of resistive memory material and a low oxidation electrode.

20. The apparatus of claim 19, wherein both of the low oxidation electrodes are located between the layers of resistive memory material.

21. The apparatus of claim 19, further comprising an interconnect located within the void, the interconnect located between the low oxidation electrodes.

22. The apparatus of claim 19, wherein at least one of the portions comprises an insulating metal oxide layer.

23. The apparatus of claim 18, wherein the lithography process layers comprise at least one mask layer or etch stop layer.

* * * * *